(12) United States Patent
Vilander

(10) Patent No.: US 6,788,161 B2
(45) Date of Patent: Sep. 7, 2004

(54) INTEGRATED OSCILLATOR CIRCUIT THAT INHIBITS NOISE GENERATED BY BIASING CIRCUITRY

(75) Inventor: Ari Vilander, Kerava (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/292,103

(22) Filed: Nov. 12, 2002

(65) Prior Publication Data

US 2004/0090281 A1 May 13, 2004

(51) Int. Cl.$^7$ ............................................... H03L 1/00
(52) U.S. Cl. ........................ 331/185; 331/175; 331/180
(58) Field of Search ................................. 331/185, 175, 331/180, 186, 36 C

(56) References Cited

U.S. PATENT DOCUMENTS

| | | | |
|---|---|---|---|
| 3,828,278 A | * 8/1974 | Rees | 331/116 FE |
| 5,471,652 A | 11/1995 | Hulkko | 455/76 |
| 5,764,109 A | 6/1998 | Kukkonen | 331/44 |
| 5,859,573 A | 1/1999 | Kukkonen | 331/75 |
| 5,920,236 A | * 7/1999 | Ishizaki | 331/185 |
| 5,926,071 A | 7/1999 | Kukkonen | 331/109 |
| 6,414,522 B1 | * 7/2002 | Nguyen et al. | 327/101 |

* cited by examiner

Primary Examiner—Robert Pascal
Assistant Examiner—Joseph Chang
(74) Attorney, Agent, or Firm—Harrington & Smith, LLP

(57) ABSTRACT

Disclosed is an oscillator circuit (1A) for use in a local oscillator of an RF communications device (100) that communicates over an RF channel. The oscillator circuit includes an oscillator circuit portion (2) and a bias circuit portion (3) coupled to the oscillator circuit portion for setting the operating point of the oscillator transistors. The oscillator circuit further includes a switch (6) for selectively one of connecting or disconnecting the bias circuit portion from the oscillator circuit portion, and a capacitance (5) for storing an output of the bias circuit portion during a time that the switch disconnects the bias circuit portion from the oscillator circuit portion, thereby maintaining control of the operating point of the oscillator transistors of the oscillator circuit portion. When the switch is open any noise generated by the biasing circuit portion is prevented from reaching the oscillator circuit portion, thereby reducing the overall noise floor of the oscillator circuit. The capacitance may have a value that is measured in tens of picofarads, and the oscillator circuit, including the capacitance, is formed within an integrated circuit.

31 Claims, 8 Drawing Sheets

L(f) [dBc / Hz] vs f [Hz]

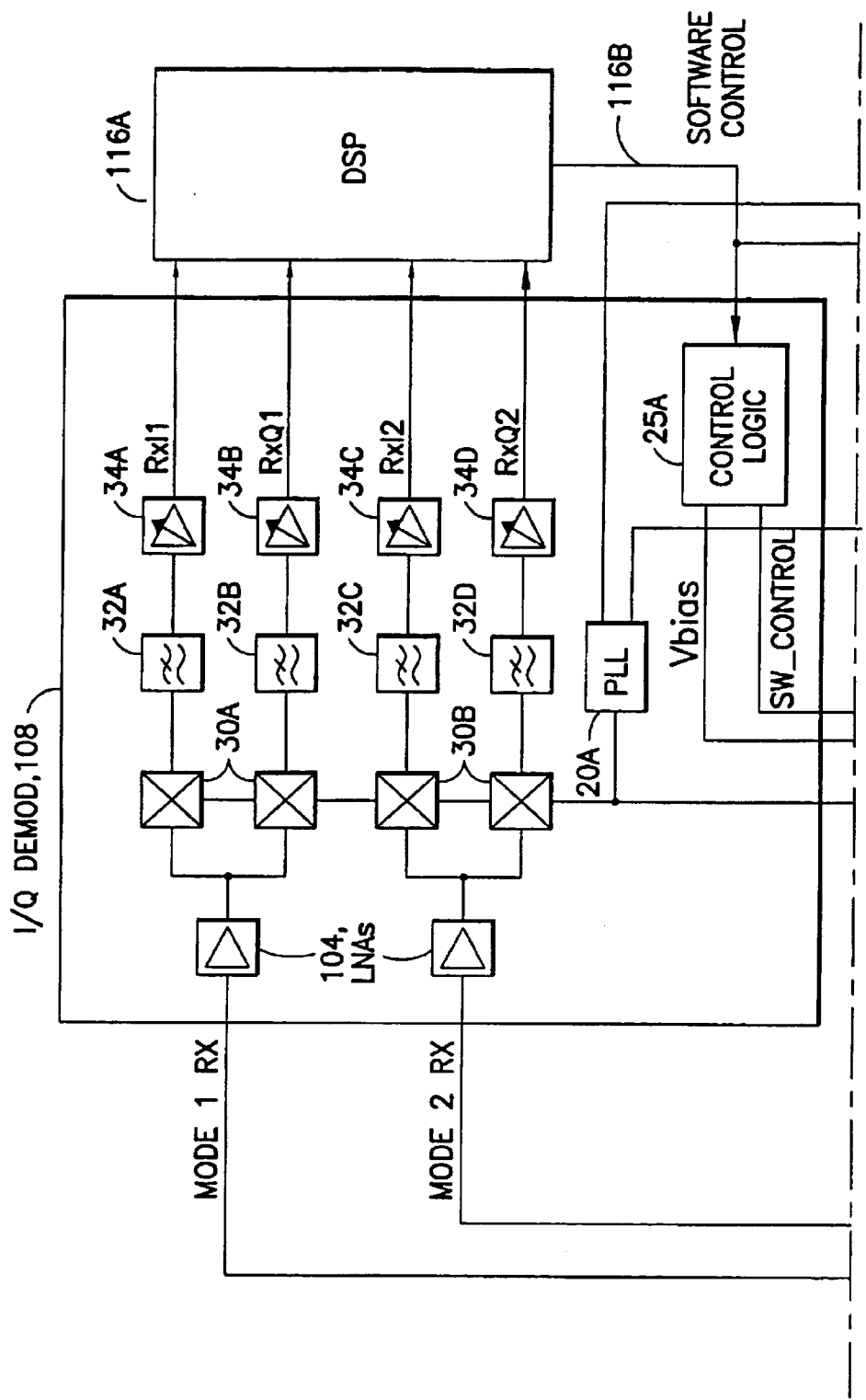

INTEGRATED OSCILLATOR CIRCUIT THAT INHIBITS NOISE GENERATED BY BIASING CIRCUITRY

TECHNICAL FIELD

These teachings relate generally to frequency sources and oscillators, and more specifically relate to voltage controlled oscillators used in mobile communication devices, in particular voltage controlled oscillators that are constructed as part of an integrated circuit.

BACKGROUND

A local oscillator (LO) signal is required for receiving and transmitting in a wireless (RF) communication device, such as a cellular telephone. A voltage controlled oscillator (VCO) is typically used in a phase-locked loop to generate the LO signal. An example of the use of a VCO in a mobile station can be found in commonly assigned U.S. Pat. No. 5,471,652, "Frequency Synthesizer and Multiplier Circuit Arrangement for a Radio Telephone", by Jaakko Hulkko. Another example of a VCO used in a mobile station can be found in commonly assigned U.S. Pat. No. 5,926,071, "Minimization of the Power Consumption in an Oscillator", by Osmo Kukkonen.

In the conventional arrangement the VCO is typically provided as a separate discrete module. However, this results in increased cost and an increase in the required circuit board area to accommodate the VCO module. As such, a desirable goal is to integrate the VCO circuitry into an existing integrated circuit package with other radio frequency (RF) circuitry, thereby reducing the cost and the required circuit board area.

However, a problem that arises when attempting to integrate the VCO circuitry is a resultant increase in the circuit noise level. An examination of this problem reveals that one significant noise source is within the VCO biasing circuitry. Filtering this noise has proven to be difficult.

FIG. 1 is a circuit diagram of a conventional RF oscillator circuit 1 that forms a part of a VCO. The oscillator circuit 1 includes an oscillator portion 2 (formed of cross-coupled transistors MP3 and MP4 and a resonator network 2A), and a bias portion 3 (formed of diode-connected transistor MP1 and current source transistor MP2, and a bias generator 3A).

The above-noted noise problem results from the fact that transistors MP3 and MP4 operate in a non-linear manner, as they are essentially switching transistors. MP3 and MP4 therefore are capable of mixing low frequency noise into the oscillator output frequency. If the biasing circuitry 3 also generates noise that appears at the output of the current source (at the drain of MP2), then the overall noise floor of the oscillator 1 is raised. Because of its low frequency, the noise generated by the biasing circuitry 3 is difficult to filter out. In practice, large inductance and capacitance values would be needed in order to adequately filter the low frequency noise. The required physical components would, however, be difficult or impossible to incorporate within an integrated circuit, and thus additional pins would be required for connecting to the external oscillator bias filter components. As can be appreciated, the requirement to provide the external VCO low frequency filter components would defeat the purpose of integrating the VCO circuitry.

FIGS. 2A and 2B illustrate two potential solutions to this problem, however neither is adequate when designing an oscillator to exhibit exacting tolerances and operational specifications, as are commonly required in modem cellular communications systems. More particularly, FIG. 2A shows the use of a simple (low inherent noise) resistor for the bias generator 3A, while FIG. 2B shows a constant current source embodiment. The approach in FIG. 2A is undesirable as the oscillator frequency can easily drift due to changes in the operating voltage or temperature, while the approach of FIG. 2B, using two parallel current sources, generates additional noise within the bias circuitry 3.

It should be noted that in conventional practice there can be two inputs to a VCO, one for biasing a capacitance diode (CD) to set the operating point of the capacitance diode into a linear region, and a second for tuning the VCO resonant frequency. Reference can be had to FIG. 8A, which is based on FIG. 1A of commonly assigned U.S. Pat. No. 5,764,109, "Voltage-Controlled Oscillator (VCO) Having a Voltage Derived from its Output to Tune its Center Frequency", by Osmo Kukkonen. In FIG. 8A the input Vcontrol (Vcrl) is typically obtained from a phased locked loop (PLL) and is used to tune the VCO resonant frequency according to a selected receiving/transmitting channel. Vcrl is typically adjusted or preset so that it is in the middle of the tuning range when the PLL is tuned to the center frequency channel. The second input (Vcf) may be provided for improving the linearity of the capacitance diode (CD, typically a varicap) such that Vcontrol (Vcrl) acts on the linear portion of the CD adjustment range. Vcf may thus be considered to function in a manner analogous to a bias voltage, at least with respect to CD. As Vcf changes the voltage between the terminals of CD it has some effect on the VCO resonant frequency, but this is typically a preset, and not a continuously variable frequency effect. The use of Vcf is optional, and depends at least in part on the characteristics of the capacitance diode and on the Vcrl tuning value and range.

Also shown in FIG. 8A is the bias generator 3A and its connection to the active part of the oscillator portion 2, specifically the cross-coupled oscillator transistors MP3 and MP4. The bias generator 3A is provided to set the operating point of the oscillator transistors MP3 and MP4, and generally will have little or no effect on the output frequency of the VCO. However, and as was discussed above, the low frequency noise output by the bias generator 3A can be mixed into the output of the VCO, and can thus appear in the RF output (RFout) of the VCO shown in FIG. 8A.

Reference with regard to VCO circuitry can also be made to commonly assigned U.S. Pat. No. 5,859,573, "Circuitry for Separating the Output of an Oscillator from the Other Parts of a Mobile Communication System", also by Osmo Kukkonen.

SUMMARY OF THE PREFERRED EMBODIMENTS

The foregoing and other problems are overcome, and other advantages are realized, in accordance with the presently preferred embodiments of these teachings.

Disclosed is an oscillator circuit for use in a local oscillator of an RF communications device that communicates over an RF channel. The oscillator circuit includes an oscillator circuit portion and a bias circuit portion coupled to the oscillator circuit portion for setting the operating point of the oscillator transistors. The oscillator circuit further includes a switch for selectively one of connecting or disconnecting the bias circuit portion from the oscillator circuit portion, and a capacitance for storing an output of the bias circuit portion during a time that the switch disconnects the bias circuit portion from the oscillator circuit portion, thereby maintaining control of the operating point of the oscillator transistors of the oscillator circuit portion. When the switch is open noise generated by the biasing circuit portion is prevented from reaching the oscillator circuit portion, thereby reducing the overall noise floor of the oscillator circuit.

In a presently preferred embodiment the bias circuit portion is constructed so as to include a current mirror transistor that is connected to a gate terminal of a current source transistor, where a drain terminal of the current mirror transistor is coupled to the oscillator circuit portion, and where the switch is interposed between the current mirror transistor and the gate terminal of the current source transistor. In this embodiment the capacitance is coupled between the gate terminal of the current source transistor and a source terminal of the current source transistor.

In accordance with an aspect of this invention, the capacitance may have a value that is measured in tens of picofarads, and the oscillator circuit, including the capacitance, is formed within an integrated circuit.

The switch may remain open for an extended period of time when operating in the same frequency band at about the same temperature (e.g., where there no operational changes and little or no environmental changes), as the capacitance is capable of storing the desired charge for long periods of time.

In one non-limiting embodiment the switch is opened during an RF burst that is received by the RF communications device from the RF channel, or the switch is opened during an RF burst that is transmitted by the RF communications device to the RF channel, depending on whether the oscillator circuit is used in the receiver or the transmitter, respectively, of the communications device.

More specifically, the switch is opened during periods when the mobile station is demodulating a received signal or modulating a signal to be transmitted, as lowest noise operation is desired at these times. At other times the switch can be closed to refresh or update the charge on the capacitance.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein:

FIGS. 6A and 6B, collectively referred to as FIG. 6, are block diagrams that show a portion of the mobile station of FIG. 5 in greater detail, in particular the use of transmit (TX) and receive (RX) VCOs that are operated and controlled in accordance with these teachings;

DETAILED DESCRIPTION OF THE PREFERRED EMBODIMENTS

FIG. 3 shows a presently preferred embodiment of an oscillator circuit 1A having an improved bias circuit in accordance with this invention. A capacitance 5 (C_charge) is added between the gate terminal of MP2 and the positive supply rail VDD. C_charge is thus effectively connected in parallel between the gate and the source of MP2. A switch (SW) 6 is also added in series between the gate of current mirror, diode-connected transistor MP1 and the node represented by the gate of MP2 and a plate of C_charge (Node_1). A switch control signal (SW_Control) is operated to selectively one of open SW 6 or close SW 6.

When SW 6 is closed the diode of current source MP1 is connected to Node_1. In this case the bias circuit 3 is assumed to be operating in a normal or Fast Mode, as a change of bias current from the bias generator 3A takes effect and is manifested immediately at the output of the current source (i.e., at the drain of MP2).

Conversely, when SW 6 is open the diode of current source MP1 is disconnected from Node_1. In this case the bias circuit 3 is assumed to be operating in a Slow Mode (in a very low pass filter mode), as a change of bias current from the bias generator 3A does not take effect, and does not appear at the output of the current source (i.e., at the drain of MP2). However, the bias current that appeared at N1 just prior to SW 6 being opened is stored on C_charge, resulting in the $V_{GS}$ of MP2 remaining constant and the output current appearing at the drain of MP2 remaining constant as well.

Figure 3A:
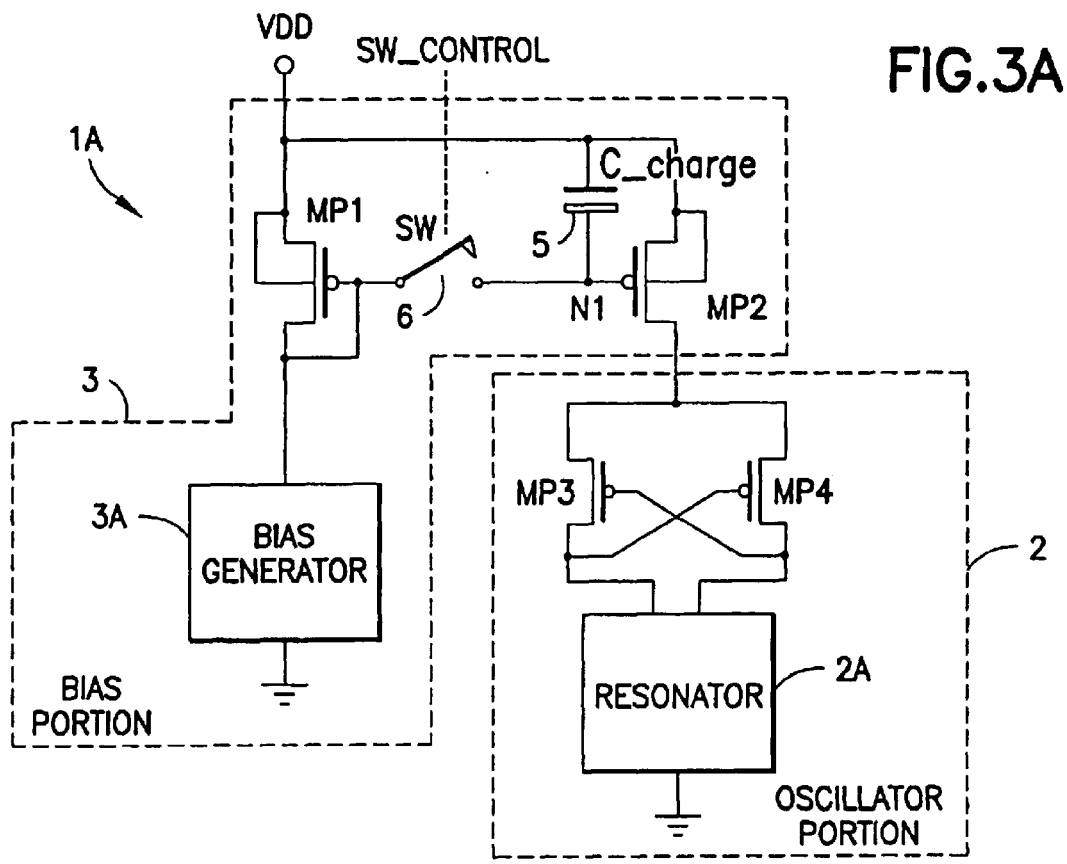
FIG. 3A is a simplified schematic diagram of an oscillator circuit, in accordance with this invention, that has an improved bias circuit.
Figure 3B:
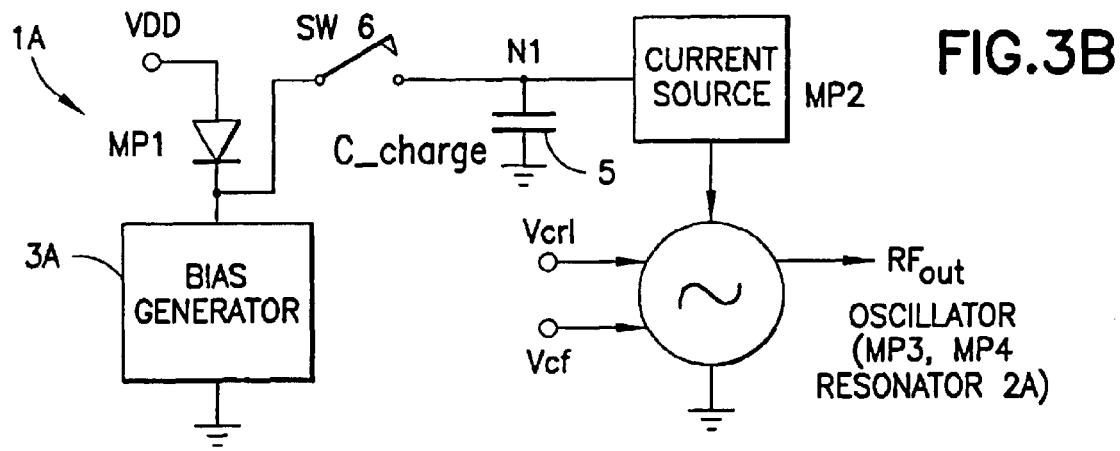
FIG. 3B is a simplified equivalent circuit of the circuit shown in FIG. 3A.
Figure 8A:
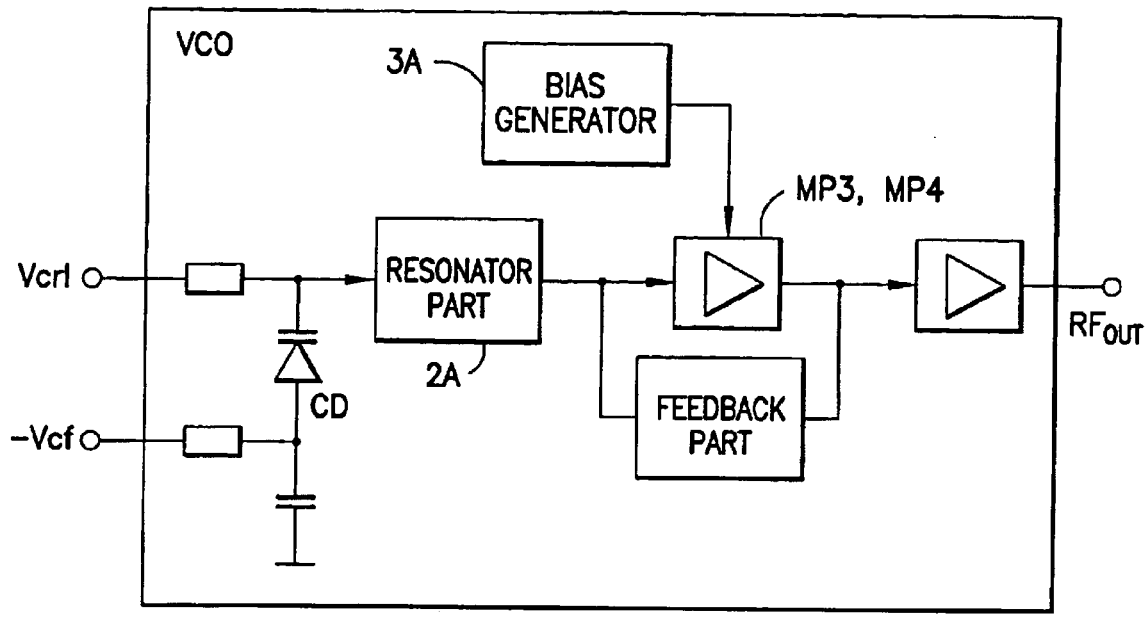
FIG. 8A shows a prior art VCO.

FIG. 3B shows a simplified equivalent circuit of the improved oscillator 1A, wherein it can be seen that SW 6 functions to disconnect the bias generator 3A from the current source (MP2), and that C_charge operates to maintain the output of the current source (drain of MP2) at an ideally constant level during the time that SW 6 is open. The effect is to isolate the current source from the noise generated in the bias generator 3A. Note that for completeness FIG. 3B also shows other inputs to the oscillator (Vcrl and the optional Vcf), as discussed above with regard to FIG. 8A. The Vcrl input is typically generated by the phase-locked loop (PLL) portion of the VCO (not shown).

Figure 3C:
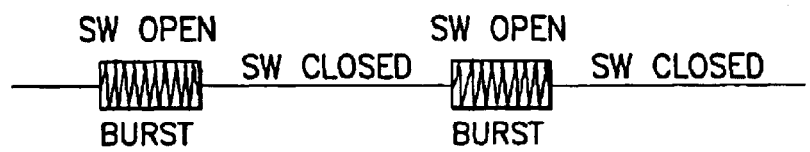
FIG. 3C is an exemplary timing diagram showing the times when the switch of FIGS. 3A and 3B is open and closed.

Referring to FIG. 3C, the disclosed circuitry enables the noise-generating portion of the bias generator 3A to be disconnected when it is desired to provide low noise VCO circuit operation, such as during a received TDMA burst, and to reconnect the bias generator 3A to recharge C_charge between bursts when low noise VCO operation is not essential. This diagram is exemplary, as it may not be desired to close the SW 6 between each burst, depending on the storage time of C_charge 5.

Figure 3D:
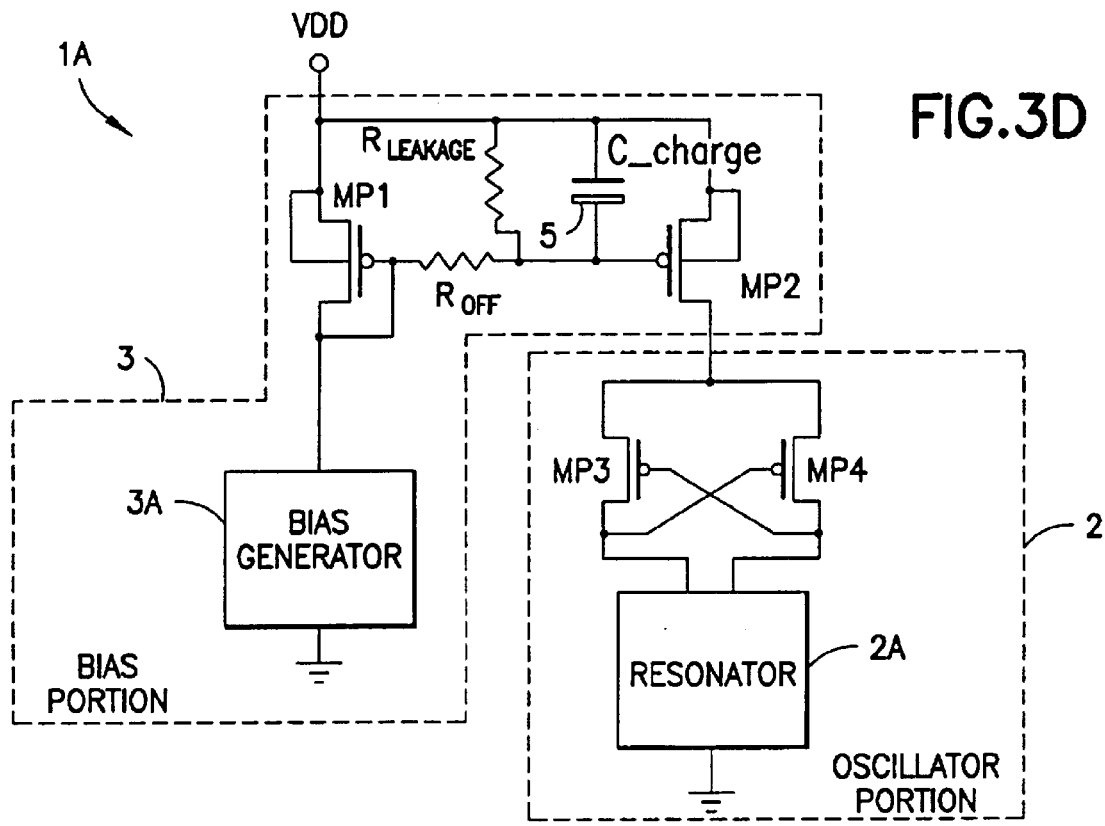
FIG. 3D is a simplified schematic diagram of the oscillator circuit of FIG. 3A, and shows a model of the non-ideal improved bias circuit.

In an ideal case C_charge would maintain its stored charge for any desired time period. However, in a practical implementation there will be some leakage associated with C_charge. SW 6, constructed using CMOS transistors, will also have some leakage and thus exhibits a finite (not infinite) open circuit resistance. This is shown in FIG. 3D, where the parasitic resistance associated with C_charge is denoted R_leakage, and the off-state resistance of SW 6 is denoted as R_off. Typically, however, R_leakage will be much greater than R_off, meaning that the error in the bias current will be small as the voltage drop across R_off is insignificant. Note in this regard that a voltage divider is formed between R_leakage and R_off, and since R_off is smaller than R_leakage, the gate of the current source transistor MP2 will remain substantially constant.

Since the impedance level is high, a small capacitance value for C_charge results in a long RC time constant. This implies that the required capacitance value for C_charge is one that can be readily accommodated within an integrated circuit (e.g., some tens of picofarads, such as about 25 picofarads), thereby enabling the low noise VCO to be integrated entirely within the integrated circuit.

Figure 4:
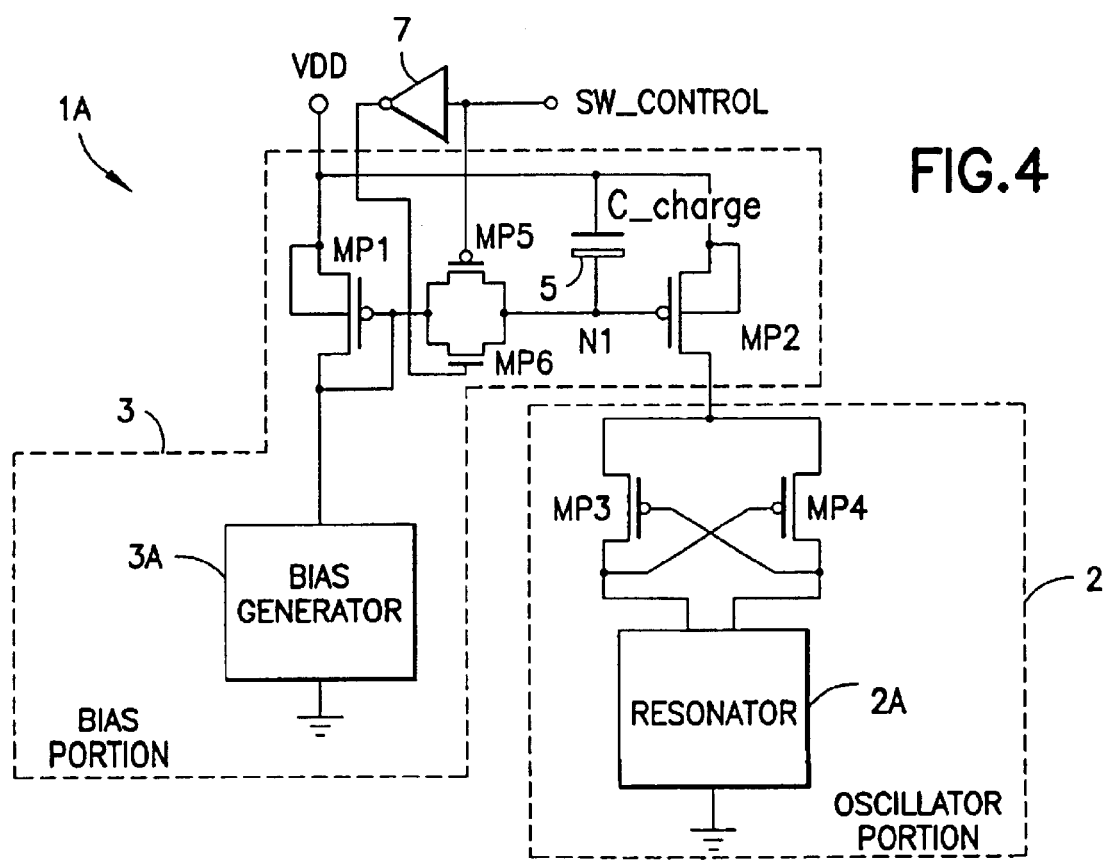
FIG. 4 is a more detailed schematic diagram of the oscillator circuit of FIG. 3A, and shows a presently preferred circuit arrangement for constructing the improved bias circuit.

FIG. 4 is a more detailed schematic diagram of the oscillator 1A circuit of FIG. 3A, and shows a presently preferred circuit arrangement for constructing the improved bias circuit. Note that SW 6 is formed from same-size P-type and N-type MOSFET transistors MP5 and MP6, respectively, and that the SW_Control signal is applied directly to the gate of the P-type MOSFET MP5 and, via inverter 7, to the gate of N-type MOSFET MP6. The use of more than one MOSFET, e.g., two MOSFETs, to implement SW 6 results in a smaller charge error during switching between the on and the off states. In other embodiments the SW 6 could be implemented using a single transistor.

Figure 1:
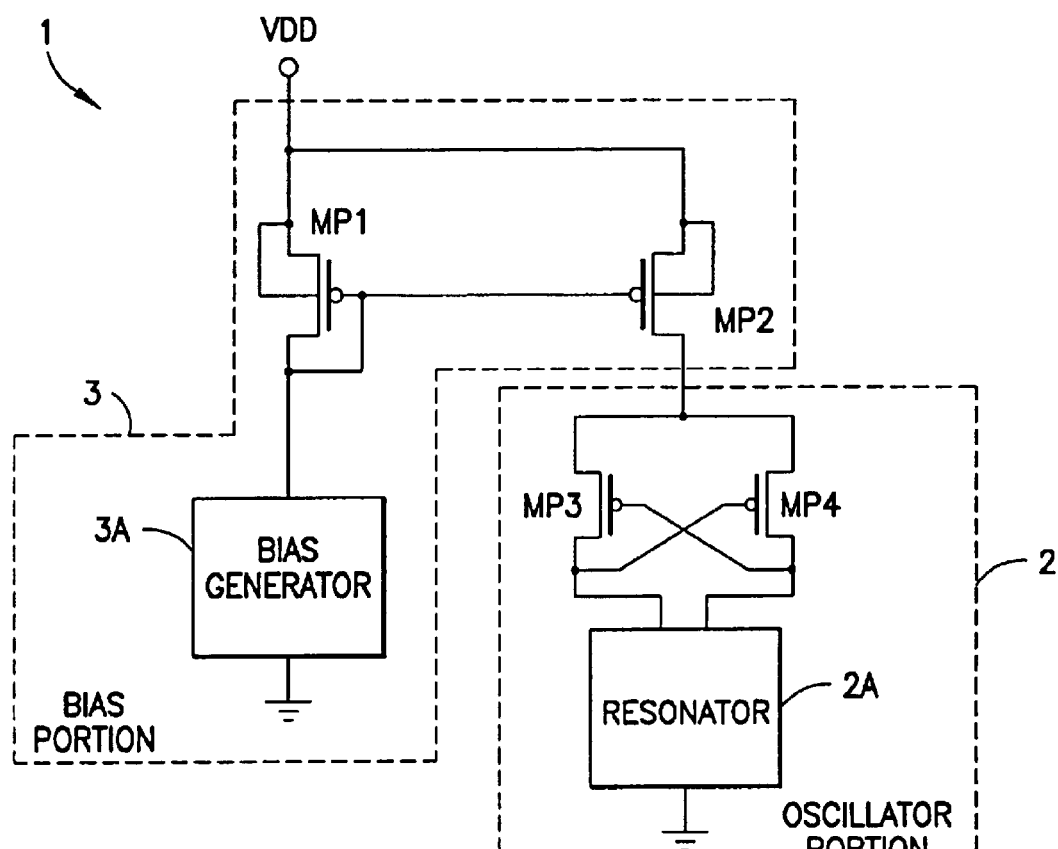
FIG. 1 is a simplified schematic diagram of a conventional oscillator circuit that exhibits low frequency switching noise.
Figure 7:
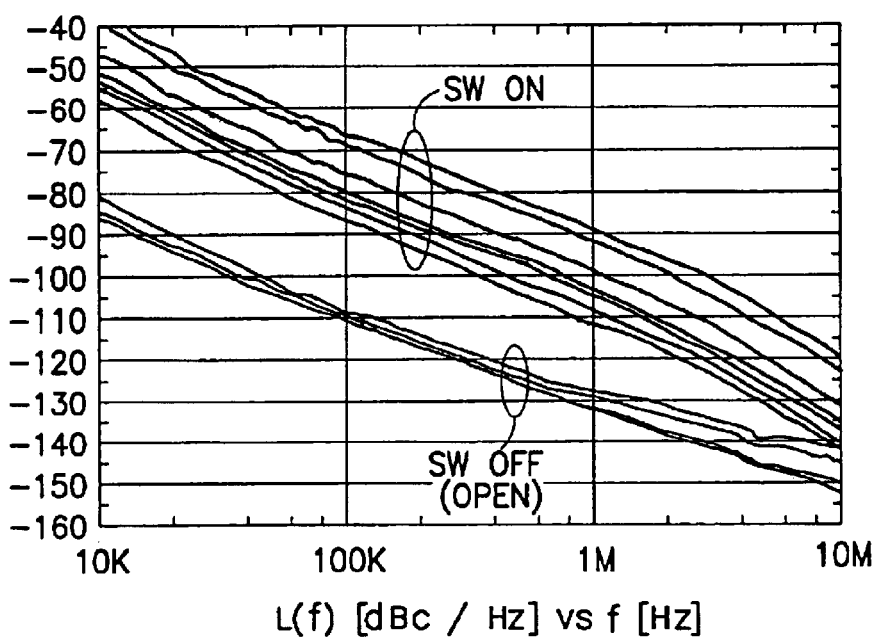
FIG. 7 is a graph showing the phase noise of the oscillator for the case of the switch being on and off.
Figure 2A:
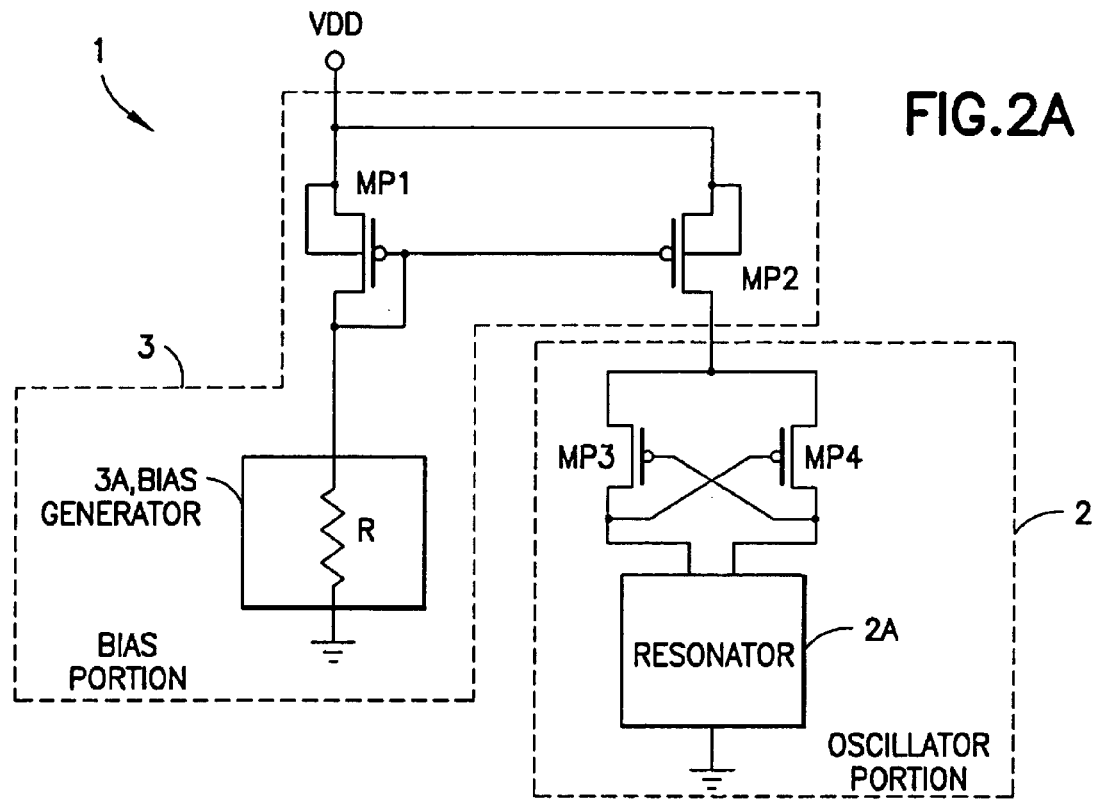
FIGS. 2A and 2B are each a schematic diagram of the oscillator circuit and show two inadequate solutions to the switching noise problem.
Figure 2B:
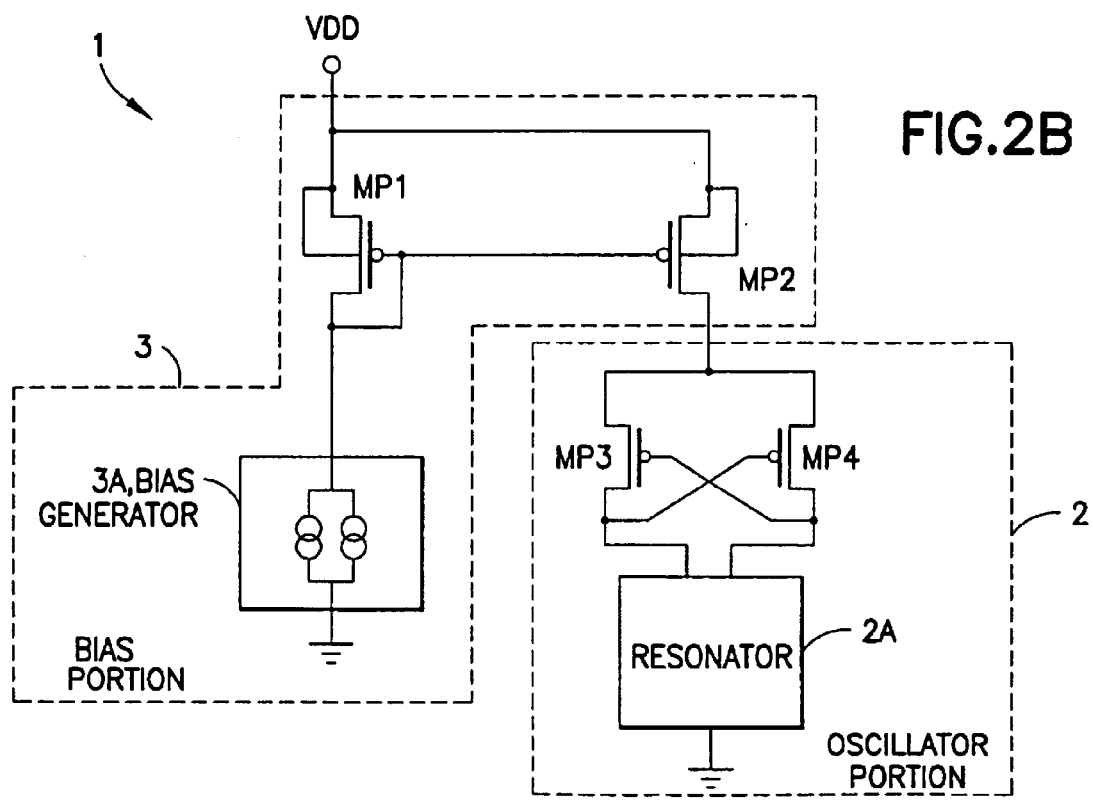

FIG. 7 is a graph showing the phase noise of the oscillator 1A for the case of the switch being on and off, plotted as L(f)[dBc/Hz] versus f(Hz), for different bias conditions. The bias input was derived by driving a noise generator. The upper group of curves are for the case when SW 6 was closed, and the lower group of curves are for the case when SW 6 was open. Note that the isolation between these two cases about 40 dB, meaning that the disclosed embodiment is capable of significantly reducing VCO circuit noise when desired.

When SW 6 is open, changes in the current occur very slowly, e.g., the 3 dB point of a passed signal is only about 1.5 Hz. As such, it should be appreciated that under certain conditions SW 6 should be closed in order to effect a rapid change in the output frequency of the oscillator 1A. The conditions can include, but need not be limited to, transitions between power down and power up states (e.g., when transitioning between mobile station sleep and awake modes, when circuitry that has been powered down is powered back up), when it is required to change the frequency of oscillation, and upon a rapid change in temperature. When powering up the frequency synthesizer it is preferred to keep SW 6 closed until the power supplies have settled. Note as well that prior to transmitting the transmitter circuitry is switched on in advance to allow the transmitter circuitry to settle, and SW 6 can be closed to allow C_charge 5 to charge, during the settling time, to a current that represents a desired operating point for the oscillator transistors MP3, MP4.

Figure 5:
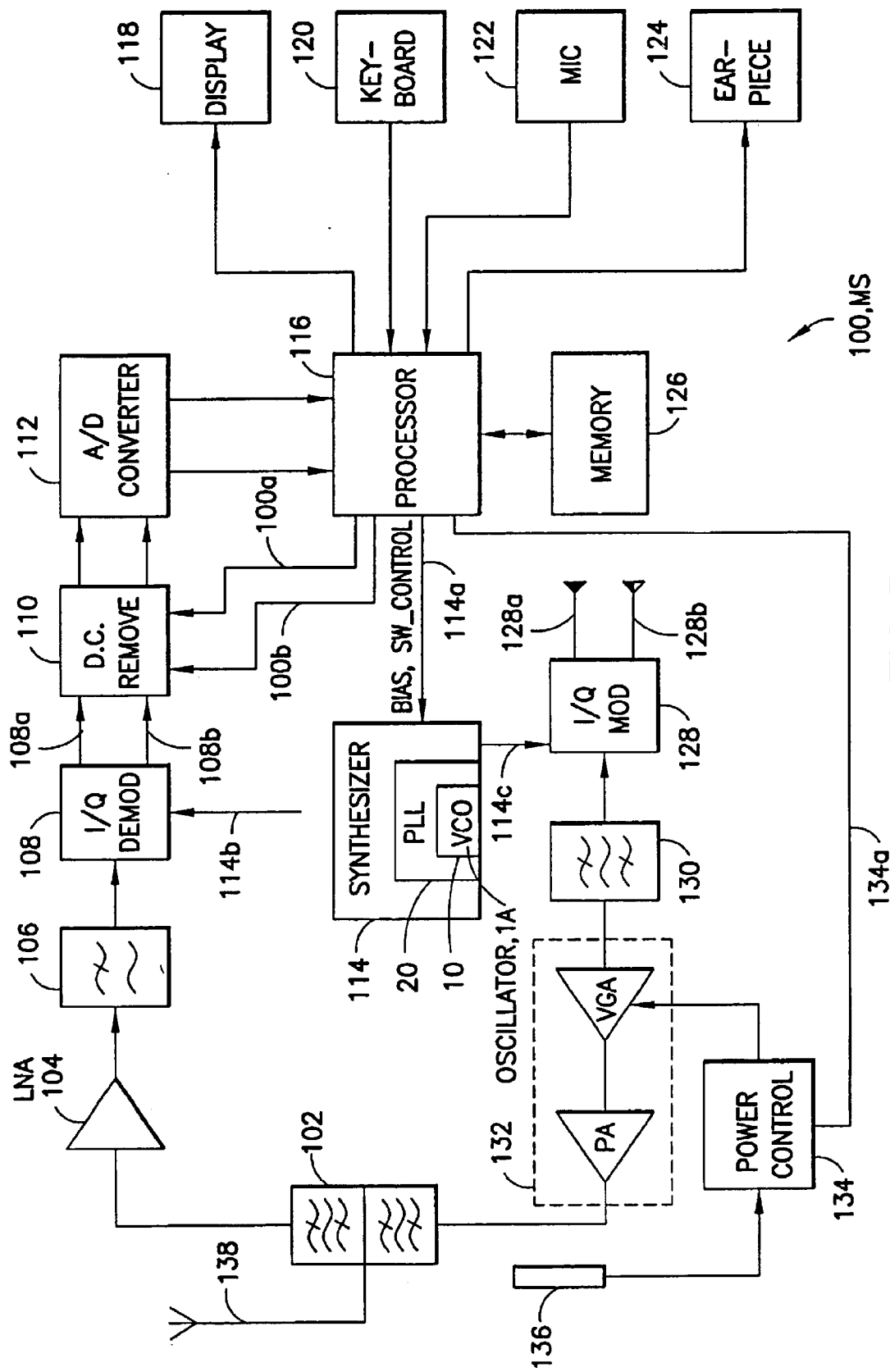
FIG. 5 is a block diagram of a mobile station that is constructed and operated in accordance with these teachings.

Reference is made now to FIG. 5 for showing a VCO 10 and a phase locked loop (PLL) 20 in the context of a wireless communication terminal transceiver, such as a cellular telephone, also referred to herein for simplicity as a mobile station 100. The VCO 10 is assumed to include the improved oscillator circuit 1A shown in FIGS. 3A–3D and 4, and is further assumed to be integrated within an integrated circuit. More specifically, FIG. 5 is a block diagram of a transmitter-receiver (transceiver) of the mobile station 100, wherein the receiver is embodied, by example only, as a direct conversion receiver. An RF signal received by an antenna 138 is conducted via a duplex filter 102 to a low noise amplifier (LNA) 104. The purpose of the duplex filter 102 is to permit the use of the same antenna both in transmitting and in receiving. Instead of the duplex filter 102, a synchronous antenna changeover switch could be used in a time-division system. An RF signal output from the LNA 104 is low-pass filtered 106 and demodulated in an I/Q demodulator 108 into an in-phase (I) signal 108a and into a quadrature (Q) signal 108b. A local oscillator signal 114b, used for I/Q demodulation, is received from a synthesizer 114. The synthesizer 114 contains the PLL 20 and the VCO 10, described in further detail below in regard to FIG. 6. In block 110, the removal of a DC voltage component is carried out, as is automatic gain control (AGC). Block 110 is controlled by a processing block 116 that may contain, for example, a microprocessor. Automatic gain control is regulated by a signal 10a and removal of the offset voltage is regulated by a signal 10b. The analog signals output from block 110 are converted into digital signals in block 112, and from which the digital signals are transferred to digital signal processing circuits in the processing block 116.

The transmitter portion of the mobile station 100 includes an I/Q modulator 128 that forms a carrier frequency signal from an in-phase (I) signal 128a and from a quadrature (Q) signal 128b. The I/Q modulator 128 receives a local oscillator signal 114c from the synthesizer 114. The generated carrier frequency signal is low-pass filtered and/or high-pass filtered by a filter 130 and is amplified by an RF amplifier 132 containing a variable gain amplifier (VGA) and a power amplifier (PA). The amplified RF signal is transferred via the duplex filter 102 to the antenna 138. A transmitter power control unit 134 controls the amplification of the RF amplifier 132 on the basis of the measured output power 136 and in accordance with a control signal 134a received from the processor 116.

The processor 116 also controls the synthesizer 114 using a programming line or bus 114a, whereby the output frequency of the synthesizer 114 is controllably changed, as when tuning to different transmission and reception channels and/or to different frequency bands. In the preferred embodiment of this invention the programming bus 114A also includes the SW_Control signal line, as shown in FIGS. 3A, 3B and 3D, and described above. The processor 116 can include a digital signal processor DSP) 116A, shown in FIG. 6 and described in further detail below.

For completeness FIG. 5 also shows, connected to the processor 116, a memory unit 126 and a user interface having a display 118, a keyboard 120, a microphone 122 and an earpiece 124.

Figure 6B:
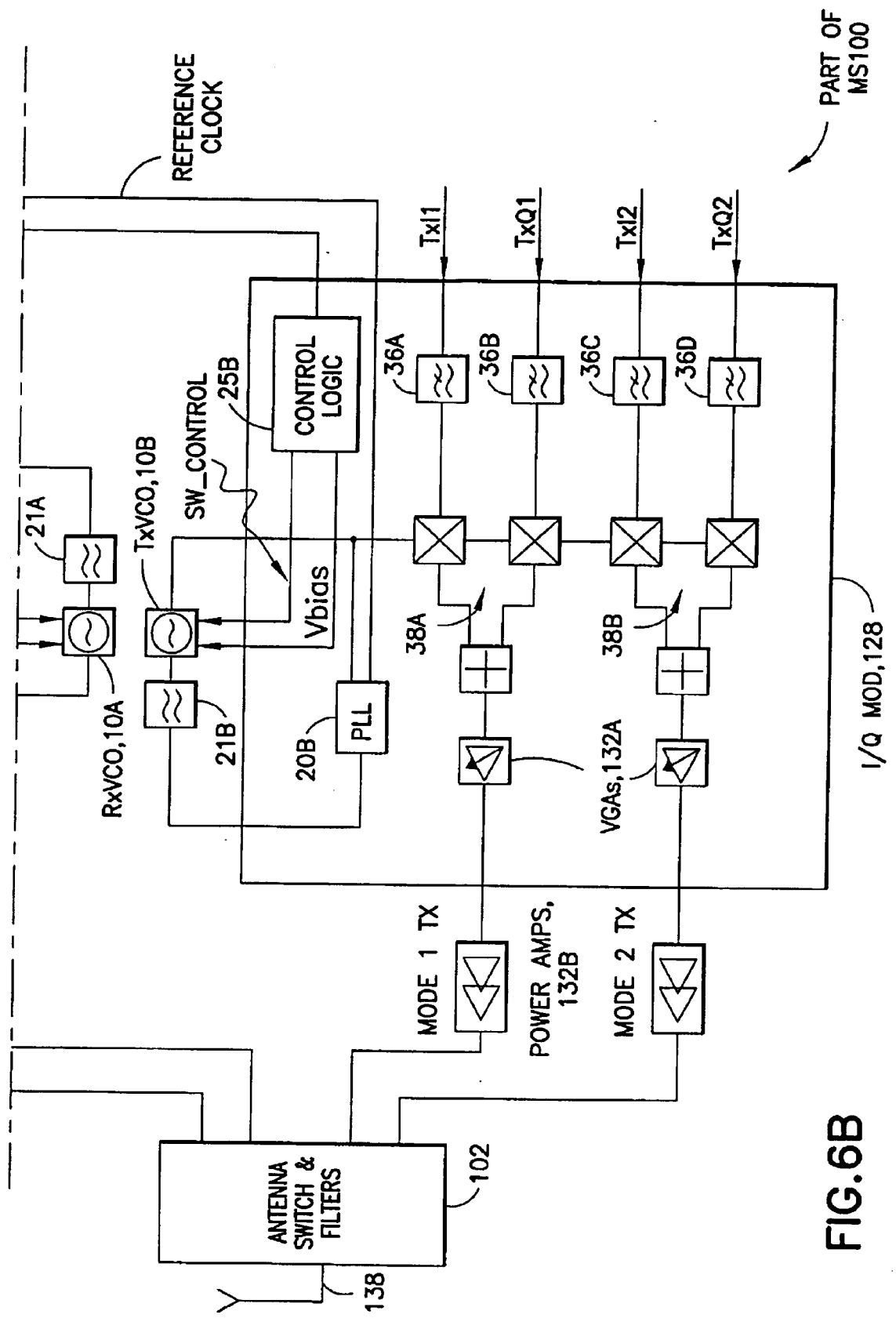

FIGS. 6A and 6B, collectively referred to as FIG. 6, show in greater detail the construction of the I/Q demodulator 108 and the I/Q modulator 128, as well as the synthesizer 114 and the DSP 116A for a dual mode (Mode 1, Mode 2) embodiment. As an example, Mode 1 is a TDMA GSM mode, while Mode 2 is WCDMA mode. Shown in the receive (RX) path in this exemplary embodiment are separate LNAs 104, a plurality of I/Q mixers 30A, 30B and associated filters 32A–32D, and variable gain amplifiers 34A–34D outputting, at any given time, either the received Mode 1 I/Q signals (RXI1, RXQ1) or the Mode 2 I/Q signals (RXI2, RXQ2) to the DSP 116A. The receive PLL 20A and associated RX_VCO 10A function as a local oscillator (LO) and provide the mixing frequency to the I/Q mixers 30A, 30B. The DSP 116A outputs over a control bus 116B control information to receive control logic 25A, which in turn can output a bias voltage (Vbias) signal and the SW_Control signal to the RX_VCO 10A.

The transmit (TX) side is constructed so as to basically mirror the RX side, and includes a plurality of input filters 36A–36D for the incoming TXI1, TXQ1 and TXI2, TXQ2 signals to be transmitted. Mode 1 and 2 I/Q modulators 38A and 38, respectively, receive their respective mixing frequencies from the PLL 20B/TX_VCO 10B, and provide their outputs to variable gain amplifiers (VGAs) 132A and power amplifiers 132B, shown collectively in FIG. 5 in circuit block 132. As in the receive side, the DSP 116A controls the magnitudes of the TX_VCO 10B Vbias voltage, and the state of the SW_Control signal, using TX control logic block 25B.

For completeness each of the RX and TX PLLs 20A and 20B is shown to contain a loop filter 21A, 221B, respectively, and receives a (common) reference clock.

The specific mobile station 100 construction shown in FIGS. 5 and 6 is exemplary, and is not to be construed in a limiting sense upon the practice of these teachings. For example, a superheterodyne type of RF architecture could be employed in other embodiments, as opposed to the direct conversion architecture depicted in FIGS. 5 and 6.

The switch SW 6 is preferably opened during periods when the mobile station 100 is demodulating a received signal or modulating a signal to be transmitted, as lowest noise operation is desired at these times. As was discussed above, at other times SW 6 can be closed to refresh or update the charge on the capacitance C_charge 5.

In the illustrated embodiments the SW_Control signal can be turned off (opening SW 6) during periods when no transmission or reception is required, and turned on (closing SW 6) otherwise to provide the low noise, integrated VCO function. As may be apparent, the receive VCO 10A can be controlled separately from the transmit VCO (10B), such that, for example, at any given time the SWs 6 in each associated oscillator 1A could both be open, could both be closed, or could be in different states (one open and one closed.)

It can be appreciated that SW 6 and C_charge operate together in a manner that is similar to a sample and hold (S/H) function, where the value of the bias generator 3A is sampled by the C_charge capacitance when SW 6 is closed, and then held by the C_charge capacitance when SW 6 is open. In accordance with an aspect of this invention, the bias signal that is stored or held by C_charge is inherently less noisy than the bias signal output by the bias generator 3A, and thus provides for a higher quality oscillator output signal that is suitable for use in, for example, a VCO of a wireless communications terminal.

Figure 8B:
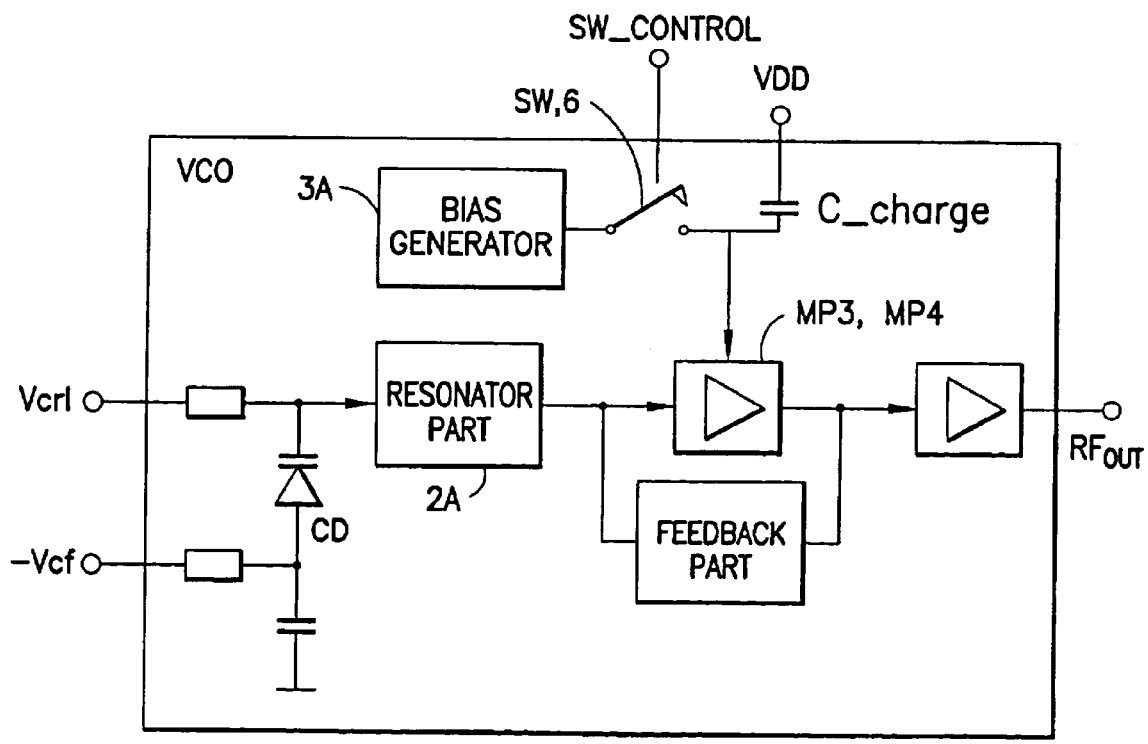
FIG. 8B shows an improved VCO in accordance with this invention.

Referring to FIG. 8B, it can be seen that SW 6 and C_charge are interposed between the output of the bias generator 3A and the active circuit block that contains MP3 and MP4. By the use of the SW_Control signal the bias generator 3A can be effectively disconnected from the active circuit block, while C_charge maintains the desired bias on the MP3 and MP4, and thereby maintains control over the operating point of MP3 and MP4. Disconnecting the bias generator 3A has the effect of significantly reducing the effect of bias generator induced noise on the VCO output signal RFout.

The bias generator 3A may take any suitable form, and may be conventional in construction. The bias generator 3A could also be used in common for several circuits within the mobile station 100, eliminating a requirement to provide a dedicated bias generator for the VCO circuit. It is thus within the scope of this invention to drive the bias generator 3A to a desired output value (such as by using the Vbias signal in FIGS. 5 and 6), then close SW 6 to sample and store the output of the bias generator 3A on C_charge, then open SW 6 for providing low noise operation of the VCO, and then subsequently switchably connect and/or program the bias generator 3A for use in another circuit of the mobile station 100.

Based on the foregoing description it can be appreciated that this invention provides in one aspect thereof the mobile station 100 that includes the RF receiver (104–112) for demodulating a signal received from a receive RF channel, the RF transmitter (128–136) for modulating a signal to be transmitted to a transmit RF channel, the control unit 116 and at least one tunable local oscillator 1A for providing an output frequency to at least one of the RF receiver and the RF transmitter. The local oscillator 1A includes the bias generator 3A that outputs a bias signal for setting the operating point of the oscillator transistors MP3 and MP4, and further includes the switch 6 for selectively coupling or decoupling the output of the bias generator 3A. Also included is a capacitance (C_charge) for holding the last value of the bias signal when the output of the bias generator 3A is decoupled. The control unit 116 controls the switch 6 to couple the output of the bias generator 3A in response to an occurrence of a change in operational state. The change of operational state can include powering-up at least one of the local oscillator 1A, the RF receiver and the RF transmitter. The change of operational state may also include switching operation from a current RF channel having a first frequency to another RF channel having a second frequency that differs from the first frequency.

In a further aspect of this invention the local oscillator 1A may be said to include a sample and hold (S/H) function that is disposed between the bias generator 3A and the oscillator 2. In this case the bias generator 3A outputs the bias signal for setting the operating point of the oscillator transistors, and the sample and hold function includes the switch 6 for selectively coupling or decoupling the output of the bias generator 3A and the capacitance (C_charge) for holding the last value of the bias signal when the output of the bias generator 3A is decoupled. The control unit 116 controls the switch 6 to decouple the output of the bias generator 3A to reduce an effect of bias generator noise on the frequency output by the oscillator 2. For example, the switch 6 may be controlled to decouple the output of the bias generator 3A at least during a time that the RF receiver demodulates the signal received from the receive RF channel and/or it may be controlled to decouple the output of the bias generator 3A at least during a time that the RF transmitter modulates the signal to be transmitted to the transmit RF channel.

The specific circuitry shown above is not intended to be viewed as a limitation upon the practice of this invention, as those skilled in the art will recognize that other circuit embodiments having more or fewer components could be employed to construct a working oscillator and VCO. Furthermore, this invention is not limited for use in burst-type communications systems, such as TDMA systems, as the teachings of this invention could be applied as well to CDMA and other types of systems. Thus, it should be appreciated that while these teachings have been presented in the context of certain presently preferred embodiments, that changes in form and detail may be made by those skilled in the art, when guided by these teachings, and that these changes will still fall within the scope of the teachings of this invention.

What is claimed is:

1. An oscillator circuit for use in a local oscillator of an RF communications device that communicates over an RF channel, said oscillator circuit comprising:
   an oscillator circuit portion; and
   a bias circuit portion coupled to the oscillator circuit portion for setting an operating point of transistors of the oscillator circuit portion; further comprising
   a switch for selectively one of connecting or disconnecting the bias circuit portion from the oscillator circuit portion; and
   a capacitance for storing an output of the bias circuit portion during a time that the switch disconnects the bias circuit portion from the oscillator circuit portion for maintaining control of the operating point of the transistors of the oscillator circuit portion, wherein oscillator frequency is stable with a constant bias.

2. An oscillator circuit as in claim 1, where said bias circuit portion comprises a current mirror transistor that is connected to a gate terminal of a current source transistor, where a drain terminal of the current mirror transistor is coupled to the oscillator circuit portion, and where said switch is interposed between said current mirror transistor and said gate terminal of said current source transistor.

3. An oscillator circuit as in claim 2, where said capacitance is coupled between said gate terminal of said current source transistor and a source terminal of said current source transistor.

4. An oscillator circuit as in claim 1, where said capacitance has a value measured in tens of picofarads, and where said oscillator circuit, including said capacitance, is formed within an integrated circuit.

5. An oscillator circuit as in claim 1, where when said switch is open noise generated by said biasing circuit portion is prevented from reaching said oscillator circuit portion.

6. An oscillator circuit as in claim 1, where said switch is open during an RF burst that is received by said RF communications device from said RF channel.

7. An oscillator circuit as in claim 1, where said switch is open during an RF burst that is transmitted by said RF communications device to said RF channel.

8. An oscillator circuit as in claim 1, where said switch is open during a time that said RF communications device demodulates a signal received from said RF channel.

9. An oscillator circuit as in claim 1, where said switch is open during a time that said RF communications device modulates a signal to be transmitted to said RF channel.

10. A method to operate an oscillator circuit used in a local oscillator of an RF communications device that communicates over an RF channel, comprising:
    providing said oscillator circuit to comprise an oscillator circuit portion and a bias circuit portion coupled to the oscillator circuit portion for setting an operating point of transistors of the oscillator circuit portion;
    selectively one of connecting or disconnecting the bias circuit portion from the oscillator circuit portion during operation of the oscillator circuit; and
    storing an output of the bias circuit portion during a time that the switch disconnects the bias circuit portion from the oscillator circuit portion for maintaining control of the operating point of the transistors of the oscillator circuit portion.

11. A method as in claim 10, where providing provides said bias circuit portion to comprise a diode-connected current mirror transistor that is connected to a gate terminal of a current source transistor, where a drain terminal of the current mirror transistor is coupled to said oscillator circuit portion, and where a switch is interposed between said current mirror transistor and said gate terminal of said current source transistor to selectively connect or disconnect the bias circuit portion from the oscillator circuit portion.

12. A method as in claim 11 where storing uses a capacitance that is coupled between said gate terminal of said current source transistor and a source terminal of said current source transistor.

13. A method as in claim 12, where providing provides said oscillator circuit, including said capacitance, within an integrated circuit.

14. A method as in claim 10, where when said switch is open noise generated by said biasing circuit portion is prevented from reaching said oscillator circuit portion.

15. A method as in claim 11, where said switch is open during an RF burst that is received by said RF communications device from said RF channel.

16. A method as in claim 11, where said switch is open during an RF burst that is transmitted by said RF communications device to said RF channel.

17. A method as in claim 11, where said switch is open during a time that said RF communications device demodulates a signal received from said RF channel.

18. A method as in claim 11, where said switch is open during a time that said RF communications device modulates a signal to be transmitted to said RF channel.

19. A mobile station, comprising:
    a radio frequency (RF) receiver for demodulating a signal received from a receive RF channel;
    a RF transmitter for modulating a signal to be transmitted to a transmit RF channel;
    a control unit; and
    at least one tunable local oscillator for providing an output frequency to at least one of said RF receiver and RF transmitter, said local oscillator comprising a bias generator that outputs a bias signal for setting the operating point of oscillator transistors, and further comprising a switch for selectively decoupling the output of the bias generator, and a capacitance for holding the last value of the bias signal when the output of the bias generator is decoupled, where said control unit controls said switch to decouple the output of the bias generator during a time that at least one of said RF receiver demodulates the signal received from the receive RF channel and said RF transmitter modulates the signal to be transmitted to the transmit RF channel.

20. A mobile station, comprising:
    a radio frequency (RF) receiver for demodulating a signal received from a receive RF channel;
    a RF transmitter for modulating a signal to be transmitted to a transmit RF channel;
    a control unit; and
    at least one tunable local oscillator for providing an output frequency to at least one of said RF receiver and RF transmitter, said local oscillator comprising a bias generator that outputs a bias signal for setting an operating point of local oscillator transistors, and further comprising a switch for selectively coupling or decoupling the output of the bias generator, and a capacitance for holding the last value of the bias signal when the output of the bias generator is decoupled, where said control unit controls said switch to couple the output of the bias generator in response to an occurrence of a change in state, wherein oscillator frequency is stable with a constant bias.

21. A mobile station as in claim 20, where the change of state comprises powering-up at least one of said local oscillator, said RF receiver and said RF transmitter.

22. A mobile station as in claim 20, where the change of state comprises switching operation from a current RF channel having a first frequency to another RF channel having a second frequency that differs from the first frequency.

23. A mobile station as in claim 20, where the change of state comprises a change in temperature.

24. A mobile station, comprising:

a radio frequency (RF) receiver for demodulating a signal received from a receive RF channel;

a RF transmitter for modulating a signal to be transmitted to a transmit RF channel;

a control unit; and at least one tunable local oscillator for providing an output frequency to at least one of said RF receiver and RF transmitter, said local oscillator comprising a sample and hold function disposed between a bias generator and an oscillator, said bias generator outputting a bias signal for setting an operating point of local oscillator transistors, said sample and hold function comprising a switch, for selectively coupling or decoupling the output of the bias generator, and a capacitance for holding a last value of the bias signal when the output of the bias generator is decoupled, where said control unit controls said switch to decouple the output of the bias generator to reduce an effect of bias generator noise on the frequency output by said oscillator, wherein oscillator frequency is stable with a constant bias.

25. A mobile station as in claim 24, where said switch is controlled to decouple the output of the bias generator at least during a time that said RF receiver demodulates the signal received from said receive RF channel.

26. A mobile station as in claim 24, where said switch is controlled to decouple the output of the bias generator at least during a time that said RF transmitter modulates the signal to be transmitted to said transmit RF channel.

27. A mobile station as in claim 24, where during a time that said switch decouples the output of the bias generator, the output of the bias generator is coupled to another circuit for providing its output thereto.

28. An oscillator circuit for use in a local oscillator of an RF communications device that communicates over an RF channel, said oscillator circuit comprising:

an oscillator circuit portion; and a bias circuit portion coupled to the oscillator circuit portion for setting an operating point of transistors of the oscillator circuit portion; further comprising a switch for selectively one of connecting or disconnecting the bias circuit portion from the oscillator circuit portion; and a capacitance for storing an output of the bias circuit portion during a time that the switch disconnects the bias circuit portion from the oscillator circuit portion for maintaining control of the operating point of the transistors of the oscillator circuit portion;

wherein said bias circuit portion comprises a current mirror transistor that is connected to a gate terminal of a current source transistor, where a drain terminal of the current mirror transistor is coupled to the oscillator circuit portion, and where said switch is interposed between said current mirror transistor and said gate terminal of said current source transistor.

29. An oscillator circuit for use in a local oscillator of an RF communications device that communicates over an RF channel, said oscillator circuit comprising:

an oscillator circuit portion; and a bias circuit portion coupled to the oscillator circuit portion for setting an operating point of transistors of the oscillator circuit portion; further comprising a switch for selectively one of connecting or disconnecting the bias circuit portion from the oscillator circuit portion; and a capacitance for storing an output of the bias circuit portion during a time that the switch disconnects the bias circuit portion from the oscillator circuit portion for maintaining control of the operating point of the transistors of the oscillator circuit portion;

wherein said switch is open during an RF burst that is received by said RF communications device from said RF channel or said switch is open during an RF burst that is transmitted by said RF communications device to said RF channel.

30. An oscillator circuit for use in a local oscillator of an RF communications device that communicates over an RF channel, said oscillator circuit comprising:

an oscillator circuit portion; and a bias circuit portion coupled to the oscillator circuit portion for setting an operating point of transistors of the oscillator circuit portion; further comprising a switch for selectively one of connecting or disconnecting the bias circuit portion from the oscillator circuit portion; and a capacitance for storing an output of the bias circuit portion during a time that the switch disconnects the bias circuit portion from the oscillator circuit portion for maintaining control of the operating point of the transistors of the oscillator circuit portion;

wherein said switch is open during a time that said RF communications device demodulates a signal received from said RF channel or said switch is open during a time that said RF communications device modulates a signal to be transmitted to said RF channel.

31. An oscillator circuit for use in a local oscillator of an RF communications device that communicates over an RF channel, said oscillator circuit comprising:

an oscillator circuit portion; and a bias circuit portion coupled to the oscillator circuit portion for setting an operating point of transistors of the oscillator circuit portion; further comprising a switch for selectively one of connecting or disconnecting the bias circuit portion from the oscillator circuit portion; and a capacitance for storing an output of the bias circuit portion during a time that the switch disconnects the bias circuit portion from the oscillator circuit portion for maintaining control of the operating point of the transistors of the oscillator circuit portion;

wherein said switch is controlled to decouple the output of the bias generator at least during a time that said RF receiver demodulates the signal received from said receive RF channel or at least during the time that said RF transmitter modulates the signal to be transmitted to said transmit RF channel.

* * * * *